(12) United States Patent
Lin et al.

(10) Patent No.: US 7,339,846 B2
(45) Date of Patent: Mar. 4, 2008

(54) METHOD AND APPARATUS FOR READING DATA FROM NONVOLATILE MEMORY

(75) Inventors: Yung Feng Lin, Taoyuan (TW); Yu Shen Lin, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/457,686

(22) Filed: Jul. 14, 2006

(65) Prior Publication Data

US 2008/0013379 A1    Jan. 17, 2008

(51) Int. Cl.
    *G11C 7/00*    (2006.01)
(52) U.S. Cl. .................. 365/203; 365/196; 365/230.03
(58) Field of Classification Search ................ 365/203, 365/196, 230.03
    See application file for complete search history.

(56) References Cited

U.S. PATENT DOCUMENTS

| | | | |
|---|---|---|---|
| 4,868,790 A | 9/1989 | Wilmoth et al. | |
| 5,771,196 A | 6/1998 | Yang | |
| 6,175,523 B1 | 1/2001 | Yang et al. | |
| 6,292,399 B1 | 9/2001 | Le et al. | |
| 6,341,088 B2 * | 1/2002 | Sakamoto et al. | 365/190 |
| 6,373,753 B1 * | 4/2002 | Proebsting | 365/189.09 |
| 6,510,082 B1 | 1/2003 | Le et al. | |
| 6,525,966 B1 | 2/2003 | Hollmer et al. | |
| 6,643,177 B1 | 11/2003 | Le et al. | |
| 6,707,740 B2 | 3/2004 | Shinozaki | |
| 6,731,542 B1 | 5/2004 | Le et al. | |
| 6,744,674 B1 | 6/2004 | Le et al. | |
| 6,768,679 B1 | 7/2004 | Le et al. | |
| 6,771,543 B2 | 8/2004 | Wong et al. | |
| 6,788,583 B2 | 9/2004 | He et al. | |
| 6,944,057 B1 | 9/2005 | Runnion et al. | |
| 2003/0128593 A1 * | 7/2003 | Shiga et al. | 365/189.02 |

OTHER PUBLICATIONS

Le, Binh Quang "Virtual-Ground Sensing Techniques for Fast, Low-Power, 1.8V Two-Bit-Per-Cell Flash Memories," PhD Dissertation Stanford University Nov. 2003, 148 pages.
Le, Binh Quang, "Virtual-Ground Sensing Techniques for a 49-ns/200-MHz Access Time 1.8-V 256-Mb 2-Bit-Per-Cell Flash Memory," IEEE J. of Solid-State Circuits 39(11) Nov. 2004, 2014-2023.
Pathak, B., et al., "A 1.8 V 64 Mb 100 MHz flexible read while write flash memory," Solid-State Circuits Conference, 2001. Digest of Technical Papers. ISSCC. 2001 IEEE International, pp. 32-33 and 424.

* cited by examiner

*Primary Examiner*—Thong Q. Le
(74) *Attorney, Agent, or Firm*—Warren S. Wolfeld; Haynes Beffel & Wolfeld, LLP

(57) ABSTRACT

Roughly described, a memory includes first and second target memory cells in a plurality of electrically adjacent memory cells all sharing a word line. The two target memory cells are separated from each other by at least one additional memory cell, and first current path terminals of the target memory cells bracket second current path terminals of the target memory cells electrically along the word line. The two target memory cells are read by connecting the first current path terminals of the two target memory cells to ground, precharging the second current path terminals of the two target memory cells to respective precharged states, and while both second current path terminals are in their respective precharged states, initiating a sense operation to read both the first and second target memory cells substantially simultaneously.

11 Claims, 4 Drawing Sheets

METHOD AND APPARATUS FOR READING DATA FROM NONVOLATILE MEMORY

BACKGROUND

1. Field of the Invention

The invention relates to programmable memory arrays, and more particularly to systems and methods for reading memory cells in such an array.

2. Description of Related Art

Memory devices are known in the art for storing data in a wide variety of electronic devices and applications. A typical memory device comprises a number of memory cells. Often, memory cells are arranged in an array format, where a row of memory cells corresponds to a word line and a column of memory cells corresponds to a bit line, and where each memory cell defines a binary bit, i.e., either a zero ("0") bit or a one ("1") bit. For example, a memory cell may be defined as either being a "programmed" cell or an "erased" cell, depending on the amount of charge stored on its floating gate. Depending on the convention chosen, an erased cell can represent a logic "1" and a programmed a logic "0," or vice versa. In one type of memory cell, each cell stores two binary bits, a "left bit" and a "right bit." The left bit can represent a "0" or a "1" while the right bit can represent a "0" or a "1" independent of the left bit.

Typically, the state of a memory cell is determined during a read operation by sensing the current drawn by the memory cell when the word line to which it is connected is brought to a particular voltage. For example, to ascertain the current drawn by a particular memory cell using drain-side sensing, the drain terminal of the memory cell is connected to a sensing circuit, the source terminal of the memory cell is connected to ground, and the word line to which the gate of the memory cell is connected is brought to a particular read voltage. The sensing circuit attempts to detect the current drawn by the memory cell, and compares the sensed memory cell current against a reference current. If the sensed memory cell current exceeds the reference current, the memory cell is considered to be in its erased state. If the sensed memory cell current is below the reference current, the memory cell is considered to be in its programmed state.

It is desirable to have the sensed memory cell current be greater than or less than the reference current by a "read margin." As used herein, "read margin" is defined as the absolute value of the difference between current drawn by a target memory cell being read and the current drawn by a reference cell during a read operation. With a sufficient read margin, the impact of extraneous factors, such as noise, for example, upon the detection of the memory cell current is greatly reduced.

In some memory circuits, read margin is reduced due to leakage currents through cells neighboring the cell being read. To illustrate this, reference is made to FIGS. 1A, 1B and 2. FIG. 1A illustrates a known memory circuit 100 corresponding to a portion of a memory device. In circuit 100, bit lines 116 and 121 are connected through a selection circuit, generally shown as Y-Paths 166a and 166b, in a manner so as to sense memory cell current 110 drawn by target memory cell 105. This arrangement may be implemented when a read operation involving memory cell 105 is to be performed. Y-Paths 166a and 166b establish connections for bit lines 116 and 121, respectively, in circuit 100 and can, for brevity, be represented by simplified Y-Path 166 as shown in FIG. 1B. FIG. 1B depicts a simplified "Y-decoder" or "Y-select path," referred to simply as "Y-Path" 166. In FIG. 1B, Y-Path 166 provides a connection between node 117 and node 118 through resistor 169, transistor 167, resistor 168, and transistor 164, when both transistors 167 and 164 are activated, e.g., by providing activation signals to respective gates of transistors 167 and 164. Resistors 168 and 169 represent resistance due to global metal bit lines and diffusion bit lines.

Continuing with FIG. 1A, bit line 121 is configured as a "drain" bit line (designated "D" in FIG. 1) by connecting node 123 to sensing circuit 160 through Y-Path 166b. Bit line 116 is configured as a "source" bit line (designated "S" in FIG. 1) by connecting node 117 to ground 165 through Y-Path 166a. Bit lines 141 and 151 are floating and may have a pattern-dependent path to ground through the neighboring memory cells. Word line 125 (designated "WL" in FIG. 1) is connected to the gate terminal of memory cell 105 and is utilized to activate memory cell 105. When memory cell 105 is activated, the amount of current 110 drawn by memory cell 105 indicates the "programmed" or "erased" status of memory cell 105. By way of illustration, if memory cell 105 is "programmed," a low current, for example less 10 μA, is drawn by memory cell 105. Conversely, if memory cell 105 is "erased," a high current, for example greater than 20 μA, is drawn by memory cell 105.

With memory circuit 100, sensing circuit 160 senses current 130 in an attempt to ascertain memory cell current 110 through memory cell 105. However, when memory cell 105 is a programmed cell, side leakage current 135 from node 123 to node 143 may be drawn when neighboring memory cell 155 and all its neighboring cells between memory cell 155 and ground are erased cells. Another potential source for leakage current 135 is transient current that could be present for charging some of the bit lines for memory cells situated on the right side of memory cell 155 in FIG. 1A. In this case, current 130 detected by sensing circuit 160 will be the sum of memory cell current 110 and leakage current 135, effectively raising current 130 and reducing the read margin during the read operation when memory cell 105 is a programmed cell. Reducing this read margin during a read operation reduces the reliability of the read operation.

FIG. 2 shows another known memory circuit 200 corresponding to a portion of a memory device. Similar to memory circuit 100 of FIG. 1, bit line 221 of memory cell 205 is configured as a "drain" bit line (designated "D" in FIG. 2) by connecting node 223 to sensing circuit 260 through Y-Path 266b, while bit line 216 is configured as a "source" bit line (designated "S" in FIG. 2) by connecting node 217 to ground 265 through Y-Path 266a, in a manner so as to sense memory cell current 210 drawn by memory cell 205. Word line 225 (designated "WL" in FIG. 2) is connected to the gate terminal of memory cell 205 and is utilized to activate memory cell 205. When memory cell 205 is activated, the amount of current 210 drawn by memory cell 205 indicates the "programmed" or "erased" status of memory cell 205.

In memory circuit 200, bit line 241 of neighboring cell 255 is configured as a "precharge" bit line (designated "P" in FIG. 2) by connecting node 243 to precharge circuit 280 through Y-Path 266c. Y-Paths 266a, 266b and 266c can be represented by Y-Path 166 as shown in FIG. 1B and described above.

Node 243 connected to bit line 241 is supplied a precharge voltage in an effort to reduce leakage current from node 223 to node 243 when target memory cell 205 is a programmed cell and neighboring memory cell 255 is an erased or over-erased cell. For example, precharge circuit 280 attempts to provide at node 243 a voltage at about the same level as that provided at node 223 by sensing circuit 260. In practice, however, the voltages at node 243 and at node 223 can vary significantly from each other, even when sensing circuit 260 and precharge circuit 280 are similarly designed. For example, the voltage difference between node 243 and node 223 may be as high as 50 millivolts (mV). Moreover, the difference in voltages between nodes 243 and 223 cannot be easily controlled and/or compensated for in memory circuit 200 because the difference in voltages at nodes 243 and 223 are due, in large part, to the different magnitudes of the currents drawn from sensing circuit 260 and precharge circuit 280, respectively, particularly when memory cell 205 is an erased cell and memory cell 255 is an erased or over-erased cell and memory cell 270 is a programmed cell.

Since the amount of current 210 drawn through memory cell 205 depends on whether memory cell 205 is an erased cell or a programmed cell, memory circuit 200 is unable to effectively control and compensate for the disparity in the currents drawn from sensing circuit 260 and precharge circuit 280, resulting in a significant voltage difference between nodes 243 and 223. Consequently, leakage current 235 from node 243 to node 223 is drawn through memory cell 255 in the case where memory cell 205 is an erased cell and neighboring memory cell 255 is an erased or over-erased cell and memory cell 270 is a programmed cell. The reason is that when memory cell 205 is an erased cell, memory cell current 210 acts to decrease the voltage supplied at node 223. As a result, the difference in voltages between nodes 243 and 223 acts to draw leakage current 235 from node 243 to node 223 through memory cell 255. In this case, sensing circuit 260 will sense current 230 corresponding to the difference between memory cell current 210 and leakage current 235, effectively reducing current 230 when memory cell 205 is an erased cell and thereby reducing the read margin during a read operation.

In U.S. Pat. No. 6,731,542, incorporated herein by reference, an attempt is made to solve this problem by connecting the sensing circuit not only to the drain of the target cell, but also to the drain of the first neighboring cell. Similarly, the precharge circuit is connected to both the drain of the second neighboring cell, beyond the first neighboring cell, and also to the drain of the third neighboring cell, beyond the second neighboring cell. In another embodiment, the sensing circuit is connected not only to the drain of the target cell, but also to the drains of each of the first two adjacent cells neighboring the target cell; and the precharge circuit is connected to the drains of each of the next three adjacent cells. Another attempt to solve the side current leakage problem appears in U.S. Pat. No. 6,771,543, also incorporated by reference herein, in which the node(s) to which the precharge voltage is connected are separated from the node(s) to which the sensing circuit is connected by one or more floating gates.

While many of the above techniques can help improve read margin by reducing side leakage currents, they do so at the expense of increased current draw for charging up additional drain (D) and precharge (P) bit lines in advance of each sense operation. It would be desirable to reduce the effective current draw while also gaining the benefits of reduced side leakage currents.

SUMMARY

All the above variations are directed to the sensing of the target cell, being the cell connected to a first drain bit line in a first group of one or more adjacent bit lines. Most of the current used to precharge the drain bit lines in the first group of adjacent bit lines, other than the one drain bit line actually connected to the target cell, is lost after the voltage of those bit lines has performed its function in reducing side leakage currents. Similarly, most of the current used to precharge the bit lines in the second group of adjacent bit lines, those to which the precharge circuit is connected, is lost after the precharged voltage of those bit lines has performed its function in reducing side leakage currents. Applicants have recognized that the step of charging the first group of bit lines is much the same as the step of charging the second group of bit lines, and that by simply reversing the roles of the two groups of bit lines, a second target cell, beyond the second group of bit lines, can be sensed at the same time that the first target cell is sensed. By taking advantage of this symmetry, it would be possible to sense two target cells for the same amount of charging current used in the prior art for sensing only one target cell. In this way the effective charging current per cell read is reduced by about half in an array having the same number of sense amplifiers as in a prior art memory array.

Thus, according to the invention, roughly described, a memory includes first and second target memory cells in a plurality of electrically adjacent memory cells all sharing a word line. The two target memory cells are separated from each other by at least one additional memory cell, and first current path terminals of the target memory cells bracket second current path terminals of the target memory cells electrically along the word line. The two target memory cells are read by connecting the first current path terminals of the two target memory cells to ground, precharging the second current path terminals of the two target memory cells to respective precharged states, and while both second current path terminals are in their respective precharged states, initiating a sense operation to read both the first and second target memory cells substantially simultaneously.

In an embodiment, roughly described, a memory includes a plurality of electrically adjacent memory cells all sharing a word line in a memory array. The plurality of cells includes a first cell and a last cell, and each of the cells in the plurality shares a bit line with each of its adjacent cells. The first and last cells are further connected to first and last bit lines, respectively, which are not shared with any other cells in the plurality. The bit lines include a first group of adjacent bit line(s) and a last group of adjacent bit line(s), the first group being adjacent to but not including the first bit line and the last group being adjacent to but not including the last bit line. The bit line in the first group that is shared with the first cell can be referred to as a first common bit line, and the bit line in the last group that is shared with the last cell in the plurality can be referred to as a last common bit line. In this arrangement, both the first and last common bit lines are precharged to respective precharged states, and while they are in their respective precharged states, a sense operation is initiated to read both the first and last cells substantially simultaneously.

Other features and advantages of the present invention will become more readily apparent to those of ordinary skill in the art after reviewing the following detailed description and accompanying drawings.

DETAILED DESCRIPTION

Figure 1A:
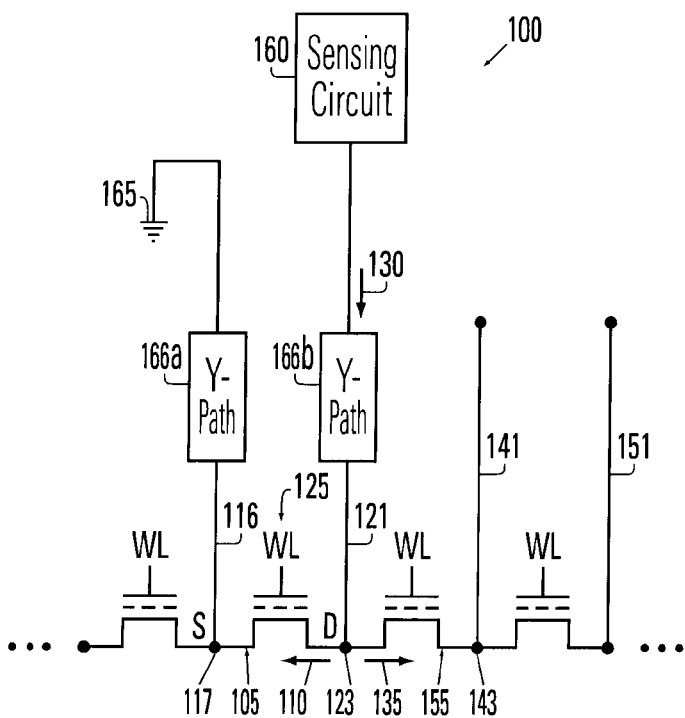
FIG. 1A depicts a circuit schematic of a known memory circuit arrangement.

The following detailed description is made with reference to the figures. Preferred embodiments are described to illustrate the present invention, not to limit its scope, which is defined by the claims. Those of ordinary skill in the art will recognize a variety of equivalent variations on the description that follows. Moreover, some of the specific details of the invention are not discussed in order not to obscure the invention.

The drawings in the present application and their accompanying detailed description are directed to merely exemplary embodiments of the invention. To maintain brevity, other embodiments of the invention are not specifically described and are not specifically illustrated in the drawings.

Figure 1B:
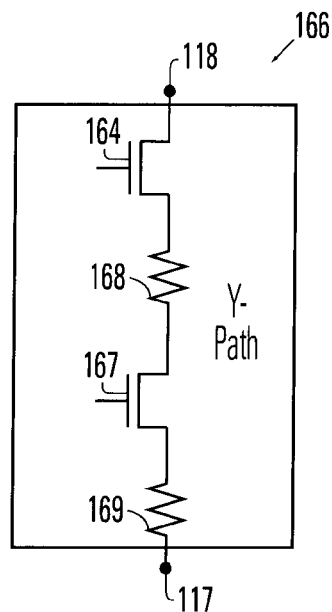
FIG. 1B depicts a simplified Y-decoder or Y-select path, designated as Y-Path.
Figure 3:
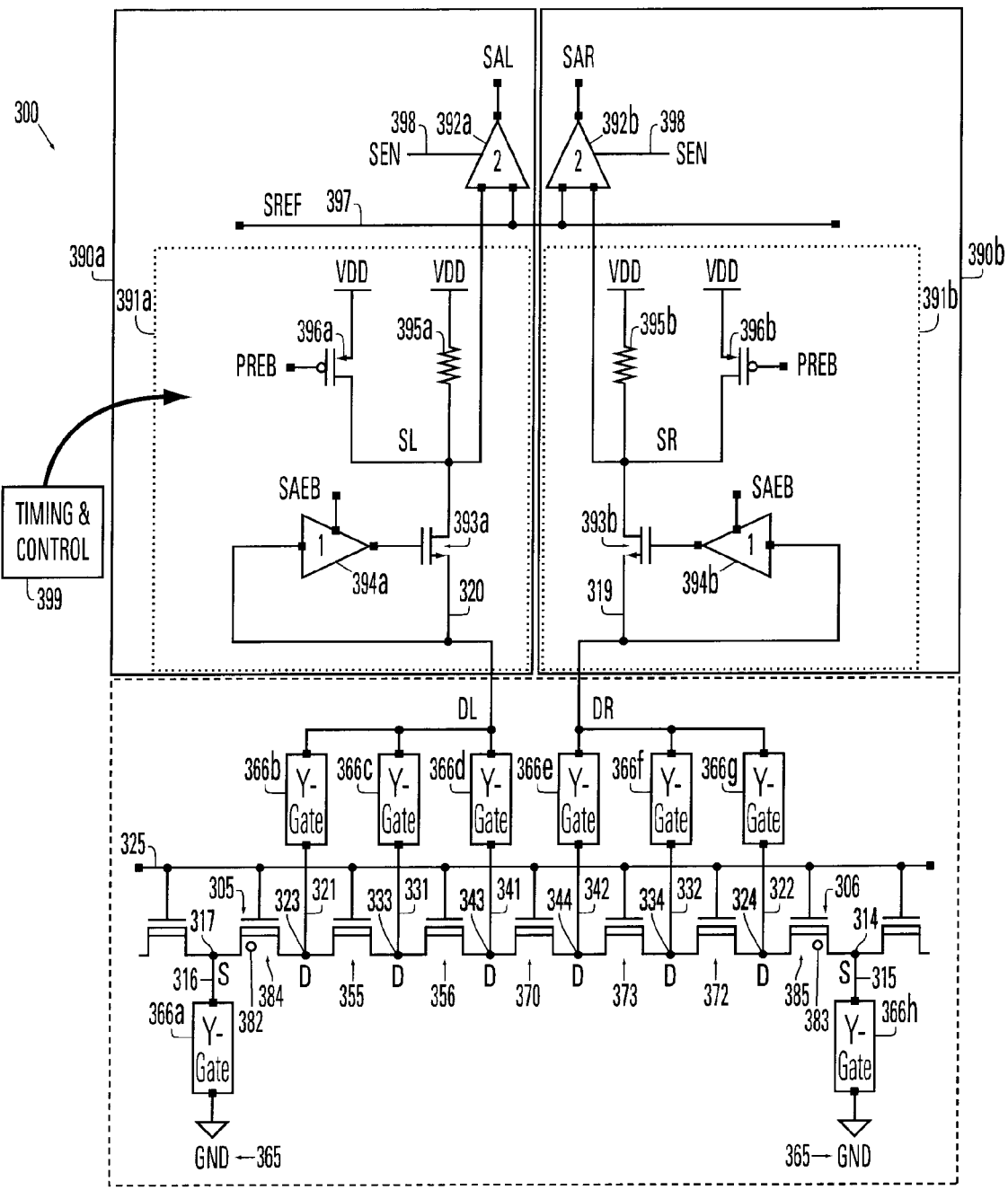
FIGS. 3, 5 and 6 depict circuit schematics of different embodiments of a memory circuit arrangement in accordance with the invention.

FIG. 3 illustrates a circuit schematic of one embodiment of a memory circuit arrangement 300 in accordance with the invention, in which two cells 305 and 306 are read simultaneously. The embodiment is suitable for use with memory cells each capable of storing two binary bits, a "left" bit and a "right" bit, often implemented with a nitride charge storage layer. However, the invention is also suitable for use with other types of memory cells, such as single level cells in a virtual ground array. Y-Gates 366*a* through 366*h* as shown in FIG. 3 and described below can be represented by Y-Path 166 as shown in FIG. 1B and described above.

Memory circuit arrangement 300 depicts a portion of a memory device including electrically adjacent memory cells 305, 355, 356, 370, 373, 372 and 306 all sharing a common word line 325 (designate "WL" in FIG. 3). Each cell includes a respective floating gate transistor having a gate terminal connected to the shared word line, and first and second source and drain terminals. The floating gate cell can be, for example, an EPROM tunnel oxide cell, or a nitride trapped cell type like SONOS. Since the source and drain terminals can be configured at any given time to function as either source or drain in a virtual ground array, they are sometimes referred to herein as first and second "current path terminals". Additionally, referring to their depiction in the drawings, they are also sometimes referred to herein as "left" and "right" current path terminals. It can be seen in the drawings that except for the cells at the far left and right in the drawings, the right current path terminal of each cell is connected to the left transistor of its next adjacent cell to the right. However, it will be appreciated that in physical implementation on an integrated circuit chip the cells may not be arranged from left to right exactly as shown in the diagrams. For this reason, the terms "left" and "right" when applied herein to the two current path terminals of a memory cell, should be interpreted merely as terminal names, and the "left" current path terminal of a given cell may not be physically to the left of the "right" current path terminal of the same cell. What matters herein is the electrical interconnection among the cells, not their physical orientation on a chip.

Moreover, cells shown adjacent to each other in the drawings need not necessarily be physically adjacent to each other on an integrated circuit chip in order to incorporate features of the present invention. Again, what matters is their electrical interconnection. For this reason, cells having connected current path terminals are sometimes referred to herein as being "electrically" adjacent.

Finally, as can be seen in FIG. 3, each node at which two of the cells are connected together is also connected to a respective bit line. For convenience, two bit lines are referred to herein as being "adjacent" bit lines if they are connected respectively to the two different current path terminals of a single cell. Again, there is no requirement that "adjacent" bit lines be physically adjacent to each other on an integrated circuit chip.

In the particular embodiment depicted in FIG. 3, memory circuit arrangement 300 depicts an exemplary arrangement when a read operation involving left bit 382 of memory cell 305 and the right bit 383 of memory cell 306 is to be performed. Although not described herein for brevity, a similar memory circuit arrangement (not shown) can be implemented in accordance with the present invention when a read operation involving right bit 384 of memory cell 305 and/or left bit 385 of memory cell 306 is to be performed. In the present discussion, memory cells 305 and 306, on which read operations are to be performed, are also sometimes referred to as first and second (or left and right) "target cells."

In memory circuit arrangement 300, bit lines 316 and 315 are configured as the "source" bit lines (designated "S" in FIG. 3) of memory cells 305 and 306 respectively, by coupling node 317 to ground 365 through Y-Path 366*a* and by coupling node 314 to ground 365 through Y-Path 366*h*. Bit line 321 is configured as "drain" bit line (designated "D" in FIG. 3) of memory cell 305 by connecting node 323 to node 320 through Y-Path 366*b*, and bit line 322 is also configured as "drain" bit line of memory cell 306 by connecting nodes 324 to node 319 through Y-Path 366*g*. Word line 325 is connected to the gate terminal of target memory cells 305 and 306, and all the cells in between, and is utilized to activate these memory cells during a read operation. When memory cell 305 is activated, the amount of current drawn by the memory cell 305 indicates the "programmed" or "erased" status of left bit 382 of memory cell 305. Similarly, when memory cell 306 is activated, the amount of current drawn by the memory cell 306 indicates the "programmed" or "erased" status of right bit 383 of memory cell 306.

Memory cell 355 is electrically adjacent to memory cell 305 and shares bit line 321 with memory cell 305 at node 323. Similarly, memory cell 356 is electrically adjacent to memory cell 355 and shares bit line 331 with memory cell 355 at node 333. Bit line 331 of memory cell 355 and bit line 341 of memory cell 356 are configured as drain bit lines. More specifically, in memory circuit arrangement 300, node 333 of bit line 331 is connected to node 320 through Y-Path 366*c* and node 343 of bit line 341 is connected to node 320 through Y-Path 366*d*. Thus bit lines 321, 331 and 341 are all connected together to node 320 through Y-Paths 366*b*, 366*c* and 366*d*. Connecting these bit lines in common to node 320 tends to reduce side leakage current that could otherwise obscure the true logic state of left bit 382 of memory cell 305.

Similarly, memory cell 372 is electrically adjacent to memory cell 306 and shares bit line 322 with memory cell 306 at node 324. Similarly, memory cell 373 is electrically adjacent to memory cell 372 and shares bit line 332 with memory cell 372 at node 334. Bit line 332 of memory cell 372 and bit line 342 of memory cell 373 are configured as drain bit lines. More specifically, in memory circuit arrangement 300, node 334 of bit line 332 is connected to node 319 through Y-Path 366*f* and node 344 of bit line 342 is connected to node 319 through Y-Path 366e. Thus bit lines 322, 332 and 342 are all connected to together to node 319 through Y-Paths 366g, 366f and 366e. Connecting these bit lines in common to node 319 tends to reduce side leakage current that could otherwise obscure the true logic state of right bit 383 of memory cell 306.

Figure 2:
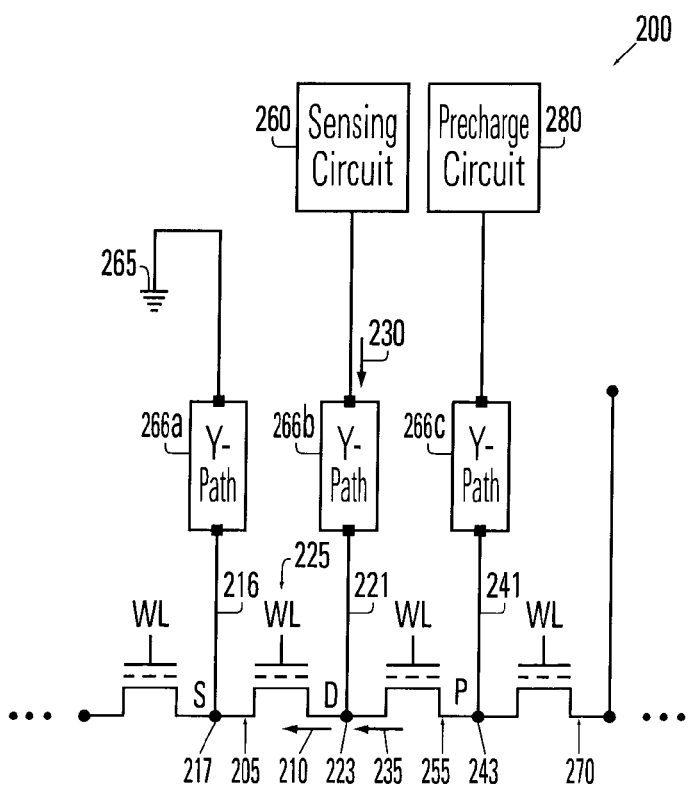
FIG. 2 depicts a circuit schematic of another known memory circuit arrangement.

The node 320 is connected to a precharging/sensing unit 390a, which can function alternatively as a precharging unit and a sensing unit. The embodiment of FIG. 3 contains a precharging circuit 391a and a sensing circuit 392a. The sensing circuit 392a may be a conventional sensing circuit, since most kinds of sensing circuits can be used in embodiments of the invention. One example of a sensing circuit that can be used with embodiments of the invention is that shown in FIG. 2.3.4 of Pathak, et. al., "A 1.8V 64 Mb 100 MHz flexible read while write flash memory [in CMOS]", published in Solid-State Circuits Conference, 2001, Digest of Technical Papers, ISSCC 2001, pages 32-33 and 424 (2001), incorporated by reference herein. Another example sensing circuit that can be used with embodiments of the invention is that shown in FIG. 4 of U.S. Pat. No. 6,707,740, also incorporated herein by reference.

In the precharging circuit 391a, the node 320 is connected to the source of an N-channel transistor 393a. Node 320 is also connected to the gate of transistor 393a through an inverting amplifier 394a. The amplifier 394a is controlled by an SAEB signal. The drain of transistor 393a is connected through a pull-up resistor 395a to VDD. The drain of transistor 393a is also connected to the drain of a P-channel transistor 396a, the source of which is connected to VDD. The gate of transistor 396a receives an active low PREB signal. The drain of transistor 393a is also connected to one input of the sense amplifier 392a. The other input of sense amplifier 392a is connected to a sense reference signal 397, which is generated by a circuit similar to the precharging circuit 391a.

The sense amplifier 392a is activated by a sense enable signal 398. This signal, as shown in FIG. 3, should be interpreted only symbolically since its actual implementation will depend on the type of circuit used to implement sense amplifier 392a. For example, sense enable signal 398 might in some embodiments constitute two or more separate "sub-signals," perhaps timed relative to one another to properly effectuate the sensing operation.

The node 319 is connected to another precharging/sensing unit 390b, which should be made as similar as possible to precharging/sensing unit 390a. In the embodiment of FIG. 3, precharging/sensing unit 390b contains a precharging circuit 391b and a sensing circuit 392b. The sensing circuit 392b should be as similar as possible to sensing circuit 392a. In the precharging circuit 391b, the node 319 is connected to the source of an N-channel transistor 393b. Node 319 is also connected to the gate of transistor 393a through inverting amplifier 394b. The amplifier 394b is controlled by the SAEB signal. The drain of transistor 393b is connected through a pull-up resistor 395b to VDD. The drain of transistor 393b is also connected to the drain of a P-channel transistor 396b, the source of which is connected to VDD. The gate of transistor 396b receives the active low PREB signal. The drain of transistor 393b is also connected to one input of the sense amplifier 392b. The other input of sense amplifier 392b is connected to the sense reference signal 397. The sense amplifier 392b is activated by the sense enable signal 398.

Figure 4:
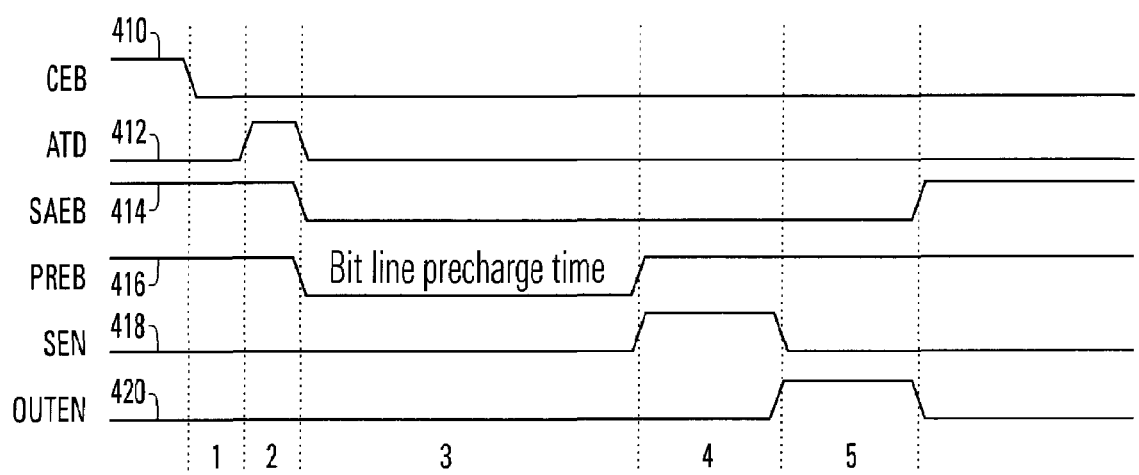
FIG. 4 is a symbolic timing diagram illustrating the operation of the precharging/sensing circuit of FIG. 3.

FIG. 4 is a symbolic timing diagram illustrating the operation of the precharging/sensing circuits 390a and 390b.

The signals illustrated in FIG. 4 are generated by a timing and control unit 399 (FIG. 3).

Initially, a read operation is triggered by a CEB signal 410 going low or an address transition. After the time period 1 in FIG. 4, an ATD signal 412 goes active for time period 2 in FIG. 4. The ATD signal causes the metal bit lines and array drain side voltages to discharge to ground. At the beginning of time period 3, SAEB (signal line 414) goes low to activate the feedback amplifiers 394a and 394b. At the same time, PREB is activated, bringing the drain of transistors 393a and 393b up to a voltage near VDD. This precharges all of the bit lines 321, 331, 341, 322, 332 and 342. When the voltage at node 320 or 319 reaches a target value, 1 volt for example, the output of respective amplifier 394a or 394b will be fed back to its input such that the current that passes through respective transistor 393a or 393b is the same, except for leakage currents, as the cell current of the respective target cell 305 or 306.

Next, at the beginning of time period 4, PREB is deactivated, terminating the precharging period. During time period 4 the drains of transistors 393a and 393b are connected to VDD only through resistors 395a and 395b, respectively. Also, at the beginning of time period 4, the sense amplifiers 392a and 392b are activated. After sensing, at the beginning of time period 5, the left and right output signals SAL and SAR are valid and can be enabled onto further circuitry by an OUTEN signal 420 in FIG. 4. At this time SAL represents the logic level corresponding to the erased or programmed state of left bit 382 of memory cell 305, and SAR represents the logic level corresponding to the erased or program state of right bit 383 of memory cell 306.

While in the timing diagram of FIG. 4, the sense enable signal 418 is activated at the same time that the precharging enable signal 416 is deactivated, it will be appreciated that in another embodiment there may be a slight delay (such as a routing delay) before the sense enable signal 418 is activated. During this delay time the voltage precharged onto the bit lines will be held by the capacitance on such bit lines, but will begin to change if the delay is too lengthy. Therefore, any delay after deactivation of precharging enable signal 416 and before activation of sense enable signal 418 should be kept as short as possible.

Also, in the embodiment of FIG. 3 the sensing operations of sense amplifiers 392a and 392b are both initiated simultaneously. This is important because the act of sensing one of the target cells, cell 305 for example, will change the voltage on the bit lines 321, 331 and 341 so that they will move away from the precharge voltage. If the delay between the initiation of sensing of one target cell and initiation of sensing of the other is too lengthy, then the bit lines adjacent to the first-sensed target cell will no longer be at the precharge voltage when sensing of the second-sensed target cell begins, and the advantages of precharging the bit lines adjacent to the first-sensed cell will be reduced. In particular, more read errors may result in the reading of the second-sensed cell.

In the embodiment of FIG. 3 the initiation of both sensing operations is kept as simultaneous as possible by using a common signal line 398 to initiate them. In practice, exact simultaneity is impossible because there is propagation delay through the signal line 398. This propagation delay can be controlled to within an acceptable range by driving the signal line 398 strongly. In another embodiment, different signal lines may be used to initiate the sensing operations of the two sense amplifiers 392a and 392b. In either case, what is important is that initiation of both sensing operations occur "substantially" simultaneously. That is, the sensing operation of the second-sensed target cell should be initiated within a short enough time frame relative to initiation of the first-sensed target cell such that the voltage on the bit lines adjacent to the first-sensed target cell is still sufficiently close to the precharge voltage when sensing of the second-sensed target cell begins, so as to keep the probability of read errors in the second-sensed target cell within an acceptable range.

As mentioned, the connection of two additional "drain" bit lines (331 and 341) configured for two adjacent memory cells 355 and 356 electrically adjacent to the first target memory cell 305 reduces the error margin loss when the bit of the first target memory cell is an erased bit, and where bits associated with the adjacent memory cells 355 and 356 are erased bits. On the other hand, the precharging of the several bit lines 322, 332 and 342 configured for other adjacent memory cells 370, 372 and 373 reduces the error margin loss when the bit of the first target memory cell 305 is a programmed bit, and where bits associated with adjacent memory cells 355 and 356 are erased bits.

The same is true for the reading of the second target memory cell 306. In particular, the connection of two additional "drain" bit lines (332 and 342) configured for two adjacent memory cells 372 and 373 electrically adjacent to the second target memory cell 306 reduces the error margin loss when the bit of the second target memory cell is an erased bit, and where bits associated with the adjacent memory cells 372 and 373 are erased bits. On the other hand, the precharging of the several bit lines 321, 331 and 341 configured for other adjacent memory cells 355, 356 and 370 reduces the error margin loss when the bit of the second target memory cell 305 is a programmed bit, and where bits associated with adjacent memory cells 372 and 373 are erased bits.

Figure 5:
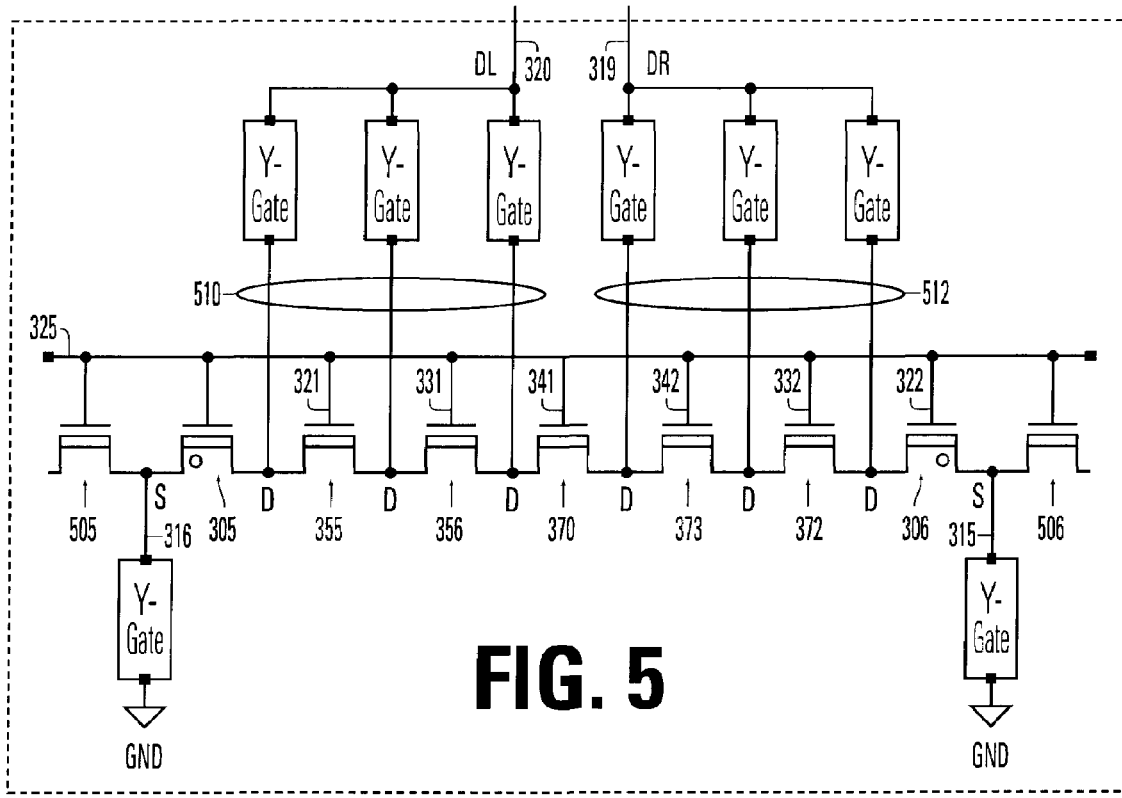

FIG. 5 is an enlargement of a portion of the memory array as shown in FIG. 3. As can be seen in FIG. 5, all of the transistors 305, 355, 356, 370, 373, 372 and 306, share a common word line 325. Along the word line, the first target cell 305 and the second target cell 306 can be referred to as the first and last cell in a set of adjacent memory cells, and the bit lines 316 and 315 can be referred to as first and last bit lines in a set of adjacent bit lines. The set of adjacent bit lines also includes a first group 510 of three adjacent bit lines 321, 331 and 341, and a last group 512 of three adjacent bit lines 322, 332 and 342. The two groups of bit lines are distinct from each other, and the first group 510 is adjacent to the first bit line 316 and the last group 512 is adjacent to the last bit line 315. Note that the first cell 305 and the first group of bit lines 510 share common bit line 321, and the last cell 306 and the last group of cells 512 share common bit line 322.

The grouping of the bit lines as shown in FIG. 5 is useful because it helps to illustrate some of the variations by which the invention can be implemented. In particular, it can be seen from FIG. 5 that the first and last groups of bit lines 510 and 512 contain three bit lines each, and the two groups are adjacent to each other. In various embodiments, each of the two groups of bit lines can contain 1, 2 or more adjacent bit lines, and the two groups can be separated by 0, 1 or more middle bit lines which remain floating during the precharging and sensing operations. The number of cells to include in the first and last groups 510 and 512 depends on a tradeoff among accuracy, power budget, and access speed, since a larger number of cells in these groups can improve accuracy, but can also increase power consumption and/or reduce access speed.

Nor is there any requirement that the number of cells in the first and last groups 510 and 512 be equal, although unequal numbers of cells can disadvantageously produce different read margins for left/right bit sensing. Also, while is desirable that all bit lines in each group 510 and 512 get connected to their respective precharging/sensing units 390a or 390b, dual memory cell sensing can still occur if one or more of the bit lines in each group remains unconnected. For example, bit lines 331 and 332 can remain unconnected in certain embodiments without preventing the simultaneous reading of both memory cells 305 and 306. However, such an arrangement might not reduce leakage currents as much as when all the bit lines of each group are connected.

Figure 6:
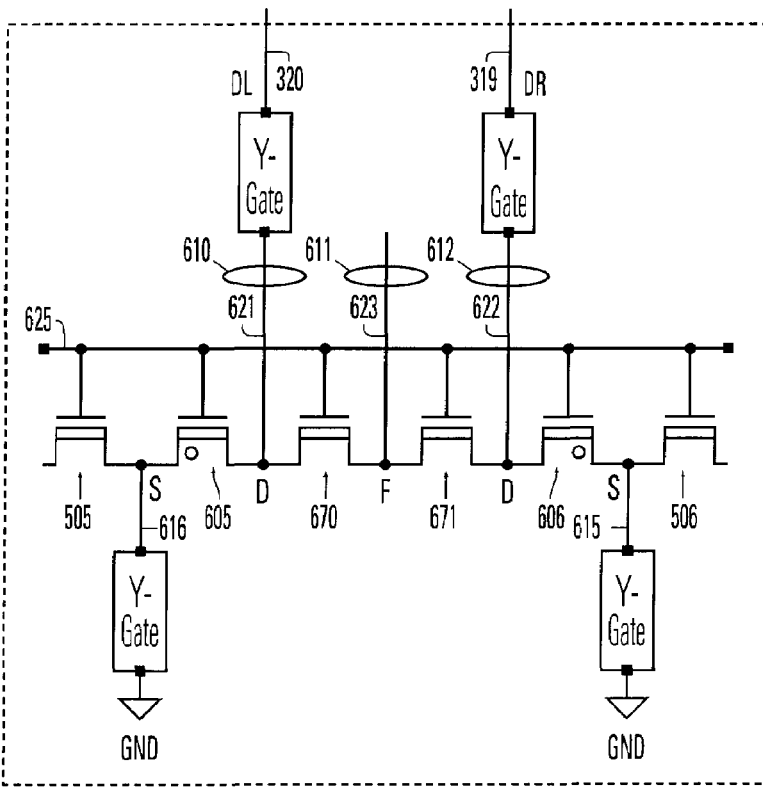

FIG. 6 illustrates one particular variation in the groupings of cells and bit lines. In the embodiment of FIG. 6, all of the transistors 505, 605, 670, 671, 606 and 506 share a common word line 625. Cells 605 and 606 are the first and second target cells, and bit lines 616 and 615 are the first and last bit lines in a set of adjacent bit lines. The first group of bit lines 610 includes only one bit line 621 in this embodiment, and the last group of bit lines 612 includes only one bit line 622. In addition, the embodiment of FIG. 6 further includes a middle group of bit lines 611, distinct from but adjacent to both the first and last groups 610 and 612, which float during the precharging and sensing operations. In the embodiment of FIG. 6, the middle group of bit lines 611 includes only one bit line 623, but in other embodiments it can include more than one bit line. By separating the two groups of bit lines by one or more floating bit line, leakage current caused by an unintentional mismatch between the precharge voltages on the two nodes 320 and 319 when one or the other of target cells 605 and 606 is in the programmed state can be reduced. On the other hand, if the two precharge voltages do match, a greater number of floating nodes between the first and second groups 610 and 612 reduces the beneficial reduction in leakage current obtained when one or the other of target cells 605 and 606 is in the programmed state.

It will be appreciated that embodiments of the invention are not required to involve more than one cell in any of groups 510 and 512 in FIG. 5, or groups 610, 611 and 612 in FIG. 6. Including more than one cell in one or more of these groups may improve performance, but is not required in order to achieve the objective of reading the two target cells at once. Thus in an aspect of the invention, the memory can be thought of as including first and second target memory cells such as 605 and 606, in a plurality of electrically adjacent memory cells all sharing a word line. The two target memory cells are separated from each other electrically along the word line, by at least one additional memory cell, such as the pair of cells 670 and 671 in FIG. 6. First current path terminals of the target memory cells (terminals connected to bit lines 616 and 615) bracket second current path terminals of the target memory cells (terminals connected to bit lines 621 and 622) electrically along the word line. The two target memory cells are then read by connecting the first current path terminals of the two target memory cells to ground, precharging the second current path terminals of the two target memory cells to respective precharged states, and while both second current path terminals are in their respective precharged states, initiating a sense operation to read both the first and second target memory cells substantially simultaneously.

It will also be appreciated that many other formulations are possible to describe embodiments of the invention.

The invention may be practiced as a method or as a device adapted to practice the method.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A method for reading memory cells in a plurality of electrically adjacent memory cells all sharing a word line in a memory array, the plurality of cells including a first cell and a last cell, each of the cells in the plurality sharing a bit line with each of its adjacent cells, the first and last cells being further connected to first and last bit lines, respectively, which are not shared with any other cells in the plurality, the bit lines including a first group of at least one adjacent bit line and a last group of at least one adjacent bit line distinct from the first group, the first group being adjacent to the first bit line and the last group being adjacent to the last bit line, the method comprising the steps of:

precharging both first and last common bit lines to respective precharged states, the first common bit line being the bit line in the first group that is shared with the first cell in the plurality, and the last common bit line being the bit line in the last group that is shared with the last cell in the plurality; and while both the first and last common bit lines are in their respective precharged states, initiating a sense operation to read both the first and last cells substantially simultaneously, wherein the step of precharging both the first and last common bit lines to respective precharged states comprises the step of precharging to respective precharge states all of the bit lines in the first and last groups of bit lines, and wherein the step of precharging to respective precharge states all of the bit lines in the first and last groups of bit lines comprises the steps of:

precharging to respective precharge states all of the bit lines in the first group of bit lines to a first precharge voltage; and precharging to respective precharge states all of the bit lines in the last groups of bit lines to a second precharge voltage.

2. A method according to claim 1, wherein the bit lines shared among cells in the plurality further include a middle group of at least one bit line, the middle group being distinct from but adjacent to both the first and last groups, and further comprising the step of floating all the bit lines in the middle group during the steps of precharging and initiating a sense operation.

3. A method according to claim 1, further comprising the steps of connecting all of the bit lines in the first group to a first common node and connecting all of the bit lines in the last group to a second common node, wherein the step of precharging both the first and last common bit lines to respective precharged states comprises the steps of connecting the first common node to a first precharge source and connecting the second common node to a second precharge source, and wherein the step of initiating a sense operation to read both the first and last cells substantially simultaneously comprises the steps of:

disconnecting the first common node from the first precharge source and connecting it to a first sense amplifier; and disconnecting the second common node from the second precharge source and connecting it to a second sense amplifier.

4. A method according to claim 1, further comprising the step of discharging all of the bit lines in the first and last groups prior to the step of precharging.

5. A memory system comprising:

a plurality of electrically adjacent memory cells all sharing a word line in a memory array, the plurality of cells including a first cell and a last cell, each of the cells in the plurality sharing a bit line with each of its adjacent cells, the first and last cells being further connected to first and last bit lines, respectively, which are not shared with any other cells in the plurality, the bit lines including a first group of at least one adjacent bit line and a last group of at least one adjacent bit line distinct from the first group, the first group being adjacent to the first bit line and the last group being adjacent to the last bit line, the bit line in the first group that is shared with the first cell in the plurality being a first common bit line, and the bit line in the last group that is shared with the last cell in the plurality being a last common bit line;

means for precharging both the first and last common bit lines to respective precharged states; and means for initiating a sense operation to read both the first and last cells substantially simultaneously, the sense operation being initiated while both the first and last common bit lines are in their respective precharged states.

6. A memory system including a control unit for reading memory cells in a plurality of electrically adjacent memory cells all sharing a word line in a memory array, the plurality of cells including a first cell and a last cell, each of the cells in the plurality sharing a bit line with each of its adjacent cells, the first and last cells being further connected to first and last bit lines, respectively, which are not shared with any other cells in the plurality, the bit lines including a first group of at least one adjacent bit line and a last group of at least one adjacent bit line distinct from the first group, the first group being adjacent to the first bit line and the last group being adjacent to the last bit line, the bit line in the first group that is shared with the first cell in the plurality being a first common bit line, and the bit line in the last group that is shared with the last cell in the plurality being a last common bit line, wherein the control unit generates control signals which cause:

both the first and last common bit lines to be precharged to respective precharged states; and while both the first and last common bit lines are in their respective precharged states, a sense operation to be initiated to read both the first and last cells substantially simultaneously.

7. A method for reading first and second target memory cells in a plurality of electrically adjacent memory cells all sharing a word line in a memory array, the first and second target memory cells each having respective first and second current path terminals, the second current path terminals of the first and second target memory cells being separated from each other electrically along the word line by at least one additional memory cell, and the first current path terminals of the first and second target memory cells bracketing the second current path terminals of the first and second target memory cells electrically along the word line, comprising the steps of:

connecting the first current path terminal of the first target memory cell through selection circuitry to ground;

connecting the second current path terminal of the first target memory cell through selection circuitry to a first sensing node;

connecting the first current path terminal of the second target memory cell through selection circuitry to ground;

connecting the second current path terminal of the second target memory cell through selection circuitry to a second sensing node;

precharging the first sensing node to a first precharge voltage;

precharging the second sensing node to a second precharge voltage; and while both the first and second sensing nodes are in their respective precharged states, initiating a sense operation to read both the first and second target memory cells substantially simultaneously.

8. A memory system comprising:

a plurality of electrically adjacent memory cells all sharing a word line in a memory array, the plurality of memory cells including first and second target memory cells, the first and second target memory cells each having respective first and second current path terminals, the second current path terminals of the first and second target memory cells being separated from each other electrically along the word line by at least one additional memory cell, and the first current path terminals of the first and second target memory cells bracketing the second current path terminals of the first and second target memory cells electrically along the word line;

means for connecting the first current path terminal of the first target memory cell to ground;

means for connecting the second current path terminal of the first target memory cell to a first sensing node;

means for connecting the first current path terminal of the second target memory cell to ground;

means for connecting the second current path terminal of the second target memory cell to a second sensing node;

means for precharging both the first and second sensing nodes to respective precharged states; and means for initiating a sense operation to read both the first and second target memory cells substantially simultaneously, the sense operation being initiated while both the first and second sensing nodes are in their respective precharged states.

9. A memory system including a control unit for reading first and second target memory cells in a plurality of electrically adjacent memory cells all sharing a word line in a memory array, the first and second target memory cells each having respective first and second current path terminals, the second current path terminals of the first and second target memory cells being separated from each other electrically along the word line by at least one additional memory cell, and the first current path terminals of the first and second target memory cells bracketing the second current path terminals of the first and second target memory cells electrically along the word line, wherein the control unit generates control signals which cause:

the first current path terminal of the first target memory cell to be connected through selection circuitry to ground;

the second current path terminal of the first target memory cell to be connected through selection circuitry to a first sensing node;

the first current path terminal of the second target memory cell to be connected through selection circuitry to ground;

the second current path terminal of the second target memory cell to be connected through selection circuitry to a second sensing node;

both the first and second sensing nodes to be precharged to respective precharged states; and while both the first and second sensing nodes are in their respective precharged states, a sense operation to be initiated to read both the first and second target memory cells substantially simultaneously.

10. A memory system according to claim 9, further comprising:

a first precharging/sensing circuit connected to the first sensing node, the first precharging/sensing circuit including first circuitry which precharges the first sensing node to a first precharge state in response to a signal from the control unit, and which senses the state of the first target memory cell in response to a signal from the control unit; and a second precharging/sensing circuit connected to the second sensing node, the second precharging/sensing circuit including second circuitry which precharges the second sensing node to a second precharge state in response to a signal from the control unit, and which senses the state of the second target memory cell in response to a signal from the control unit.

11. A memory system according to claim 10, wherein the first circuitry includes a first precharging unit and a first sensing unit which connect alternatively to the first sensing node in response to signals from the control unit, and wherein the second circuitry includes a second precharging unit and a second sensing unit which connect alternatively to the second sensing node in response to signals from the control unit.

\* \* \* \* \*